US006727768B1

(12) United States Patent
Dasgupta

(10) Patent No.: US 6,727,768 B1

(45) Date of Patent: Apr. 27, 2004

(54) RELAXATION CCO FOR PLL-BASED CONSTANT TUNING OF GM-C FILTERS

(75) Inventor: Uday Dasgupta, Singapore (SG)

(73) Assignee: Institute of Microelectronics, Singapore (SG)

(*) Notice: Subject to any disclaimer, the term of this patent is extended or adjusted under 35 U.S.C. 154(b) by 0 days.

(21) Appl. No.: 10/282,889

(22) Filed: Oct. 29, 2002

(51) Int. Cl.[7] .......... H03B 5/24

(52) U.S. Cl. .......... 331/143; 331/1 A; 331/17; 331/177 R

(58) Field of Search .......... 331/1 A, 17, 18, 331/25, 111, 143, 177 R

(56) References Cited

U.S. PATENT DOCUMENTS

| | | | |
|---|---|---|---|
| 4,377,790 A | 3/1983 | Zobel et al. | 331/111 |
| 4,535,305 A | 8/1985 | Matsuo et al. | 331/111 |
| 4,725,993 A | 2/1988 | Owen et al. | 367/139 |
| 4,963,840 A | 10/1990 | Thommen | 331/111 |
| 4,977,381 A | 12/1990 | Main | 331/111 |
| 5,070,311 A | 12/1991 | Nicolai | 331/111 |
| 5,093,634 A | 3/1992 | Khoury | 331/108 B |
| 5,418,502 A | 5/1995 | Ma et al. | 331/111 |
| 5,489,878 A | 2/1996 | Gilbert | 331/57 |
| 5,497,127 A | 3/1996 | Sauer | 331/17 |
| 5,670,915 A * | 9/1997 | Cooper et al. | 331/111 |
| 6,020,792 A | 2/2000 | Nolan et al. | 331/111 |
| 6,060,957 A | 5/2000 | Kodrnja et al. | 331/143 |
| 6,084,465 A | 7/2000 | Dasgupta | 327/554 |
| 6,111,467 A | 8/2000 | Luo | 330/305 |
| 6,201,450 B1 | 3/2001 | Shakiba et al. | 331/111 |

OTHER PUBLICATIONS

Khen Sang Tan et al., "Fully Integrated Analog Filters Using Bipolar–JFET Technology," IEEE Journal of Solid–State Circuits, vol. SC–2, pp. 814–821, Dec. 1978.

John–M. Khoury, "Design of a 15–MHz CMOS Continous–Time Filter with On–Chip Tuning," IEEE Journal of Solid––State Circuits, vol. SC–26, No. 12, pp. 1988–1997, Dec. 1991.

* cited by examiner

*Primary Examiner*—David Mis

(74) *Attorney, Agent, or Firm*—George O. Saile; Stephen B. Ackerman

(57) ABSTRACT

A relaxation current controlled oscillator (CCO) is provided by forming an integrator out of a transconductance amplifier and a capacitor. The output of the integrator is fed to comparators which in turn feed a bistable circuit. The outputs of the bistable circuit control either the polarity of the input signals to the transconductance amplifier or the polarity of the input signals to the comparators. Switches, controlled by the bistable circuit, in turn control the polarity of the input signals. The feedback path created by the transconductance amplifier, comparators, flip-flops, and switches produces continuous oscillations. A DC current input adjusts the $g_m$ of the transconductance amplifier allowing the oscillation frequency of the CCO to be adjusted. Several embodiments of CCOs are described which are fully compatible with PLLs with automatic time-constant or bandwidth tuning of a gm-C filter.

37 Claims, 10 Drawing Sheets

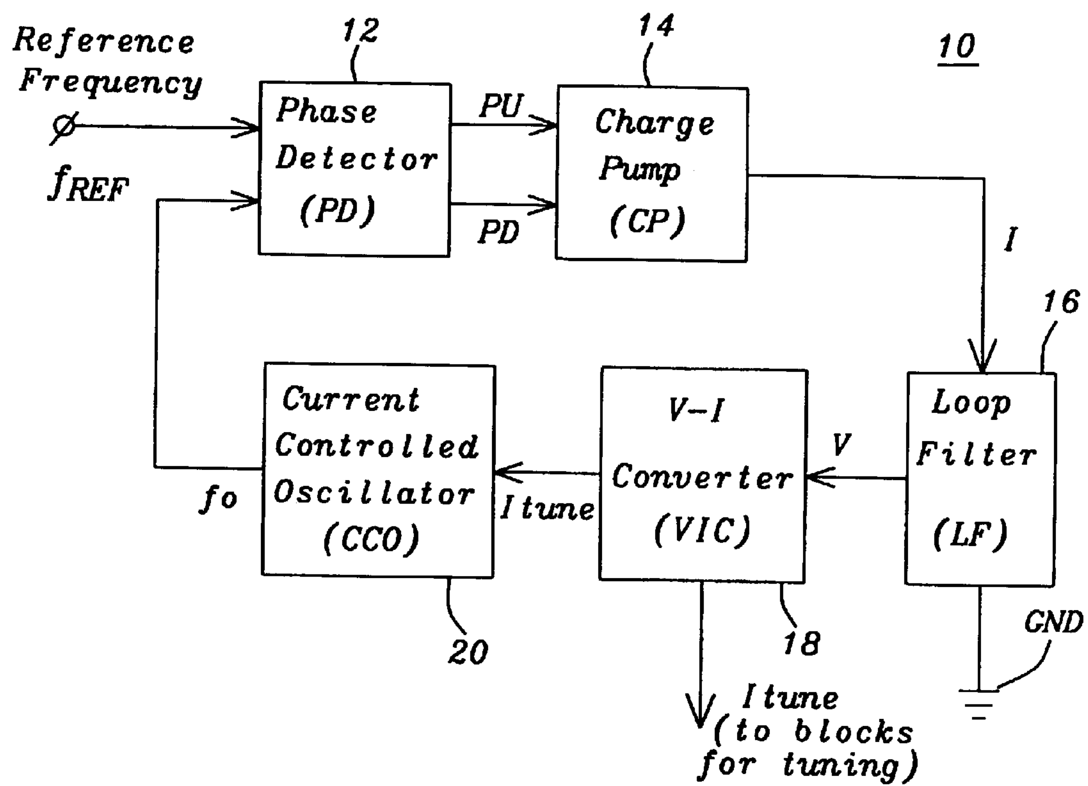
FIG. 1 – Prior Art
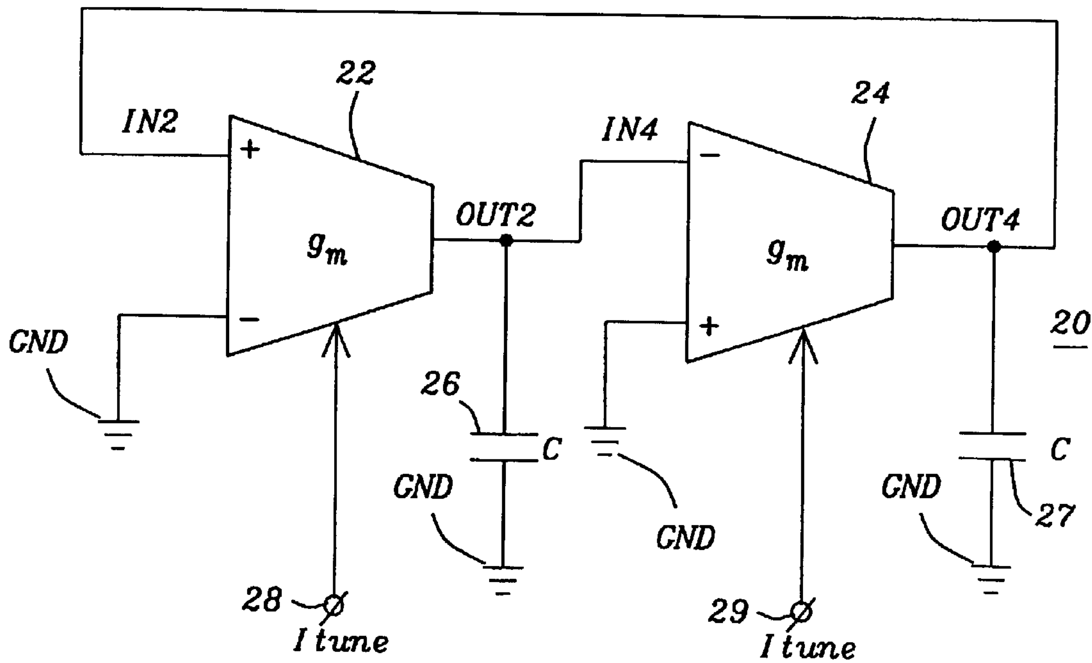
FIG. 2 – Prior Art

RELAXATION CCO FOR PLL-BASED CONSTANT TUNING OF GM-C FILTERS

BACKGROUND OF THE INVENTION

1. Field of the Invention

The invention relates to relaxation oscillators for use in PLL circuits and in particular to current controlled oscillators without start-up or amplitude control problems used in PLLs for automatic time-constant or bandwidth tuning of $g_m$-C filters.

2. Description of the Related Art

The design of a two-integrator based sinusoidal quadrature oscillator, which is widely used in phase locked loop (PLL) bandwidth tuning of $g_m$-C filters (where $g_m$-C stands for transconductance-Capacitor), is associated with amplitude control/start-up problems. See Khen Sang Tan and Paul R. Gray, "Fully Integrated Analog Filters Using Bipolar-JFET Technology", IEEE Journal of Solid-State Circuits, vol. SC-2, pp. 814–821, December 1978, and John M. Khoury, "Design of a 15 MHz CMOS Continuous-Time Filter with On-Chip Tuning", IEEE Journal of Solid-State Circuits vol. SC-26, no. 12, pp. 1988–1997, December 1991.

The above-mentioned PLL-based bandwidth-tuning scheme is shown in FIG. 1 and the two-integrator based quadrature sinusoidal current controlled oscillator (CCO) based on the traditional concept is shown in FIG. 2. The PLL-based bandwidth-tuning scheme 10 of FIG. 1 is comprised of phase detector (PD) 12, a charge pump (CP) 14, a loop filter (LF) 16, a voltage to current converter (VIC) 18, and a current controlled oscillator (CCO) 20. Block 12 receives as input the reference frequency $f_{REF}$ and from block 20 the feedback input $f_0$. Block 12 feeds block 14 which feeds block 16. The output of block 16 is a voltage which get converted by block 18 to the current $I_{tunc}$, Signal $I_{tunc}$ feeds other blocks for tuning (not shown) and block 20. FIG. 2 is a more detailed diagram of CCO 20 which shows transconductance amplifiers 22 and 24 coupled in series, each with a transconductance of $g_m$. The output OUT 2 of 22 is coupled to the negative input IN4 of 24. The output OUT4 of 24 feeds the positive input IN2 of 22. The negative input of 22 and the positive input of 24 are grounded. Blocks 22 and 24 receive equal signals $I_{tune}$ 28 and 29, respectively. The outputs OUT2 and OUT4 are coupled via equal capacitors 26 and 27, respectively, to ground. This type of sinusoidal oscillators suffers from amplitude control and startup problems U.S. Patents which have some bearing on the present invention are:

U.S. Pat. No. 6,201,450 (Shakiba et al) describes a relaxation oscillator which provides a very wide linear range of frequency variation versus control voltage (or current). U.S. Pat. No. 6,111,467 (Luo) discloses a time constant tuning circuit which uses a frequency of a clock to tune the circuit time constant. U.S. Pat. No. 6,084,465 (Dasgupta) describes a time constant tuning circuit in which a reference clock frequency is used to adjust the $g_m$ of a transconductor. U.S. Pat. No. 6,060,957 (Kodmja et al.) teaches a relaxation oscillator with low phase noise particularly applicable to PLLs. U.S. Pat. No. 6,020,792 (Nolan et al.) describes a precision relaxation oscillator with temperature compensation to produce a stable clock frequency. U.S. Pat. No. 5,497,127 presents a voltage controlled oscillator with a wide range of frequencies and which includes a relaxation oscillator. U.S. Pat. No. 5,489,878 (Gilbert) discloses an oscillator which includes two gm/C stages. U.S. Pat. No. 5,418,502 (Ma et al.) teaches the use of an R-C relaxation oscillator where two comparators control the charge/discharge of the capacitor via an SCR. U.S. Pat. No. 5,093,634 (Khoury) shows using a triple input, triple output linear transconductance amplifier as an oscillator by feeding back the output of the amplifier to the input. U.S. Pat. No. 5,070,311 (Nicolai) describes using current sources, selected by a register, to control the charge/discharge of a capacitor and thereby adjusting the frequency of an oscillator. U.S. Pat. No. 4,977,381 (Main) presents a relaxation oscillator where the direction of the current to the capacitor in the oscillator is alternated, based on the state of a bistable circuit. U.S. Pat. No. 4,963,840 (Thommen) is similar to U.S. Pat. No. 4,977,381 above but in addition reduces power consumption. U.S. Pat. No. 4,725,993 (Owen et al.) discloses a low duty cycle relaxation oscillator which periodically gates an ultrasonic frequency relaxation oscillator. U.S. Pat. No. 4,377,790 (Zobel et al.) teaches a relaxation oscillator where a capacitor is charged and discharged between an upper and lower voltage level based on a signal from a comparator. U.S. Pat. No. 4,535,305 (Matsuo et al.) describes a transmission gate relaxation oscillator using a comparator which compares the charge/discharge voltage with a reference voltage. The invention is different from all of the above cited U.S. Patents.

The invention below describes several equivalent relaxation CCOs that overcome startup/amplitude control problems of sinusoidal CCOs, are simple to design and totally compatible with modern PLL circuits.

SUMMARY OF THE INVENTION

It is an object of at least one embodiment of the present invention to provide a circuit and a method for a relaxation current controlled oscillator (CCO) for phase locked loop (PLL)-based time constant tuning of $g_m$-C filters.

It is another object of the present invention to provide a CCO which does not have amplitude control problems.

It is yet another object of the present invention to provide a CCO which does not have start-up problems.

It is still another object of the present invention to provide a CCO which is simple to design and is totally compatible with modem PLL circuits.

It is a further object of the present invention is to provide a CCO where there is great flexibility in choosing the reference frequency $f_{REF}$ or the oscillation frequency $f_0$.

It is yet a further object of the present invention is to provide a CCO with a truly 50% duty cycle output waveform.

It is still a further object of the present invention is to provide a CCO with a non overlapping output waveform.

These and many other objects have been achieved by forming a test integrator out of a transconductance amplifier and a capacitor. The output of the integrator is fed to comparators which in turn feed a bistable circuit such as a SR flip flop. The output Q and its inverse QB of the bistable circuit controls either the polarity of the input signals to the transconductance amplifier or the polarity of the input signals to the comparators (when the transconductance amplifier has a differential output). Switches, controlled by the bistable circuit, in turn control the polarity of the input signals. The feedback path created by the transconductance amplifier, comparators, flip-flops, and switches causes continuous oscillation to take place. A DC current input adjusts the $g_m$ of the transconductance amplifier allowing the oscillation frequency of the CCO to be adjusted by varying the DC current input. There is great flexibility in choosing the reference frequency $f_{REF}$ or the oscillation frequency $f_0$ by the proper choice of a resistive divider.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a block diagram of a time-constant Tuning PLL for $g_m$-C filters of the prior art.

FIG. 2 is a block diagram of a quadrature sinusoidal oscillator of the prior art.

DESCRIPTION OF THE PREFERRED EMBODIMENT

Figures 3A, 3B:
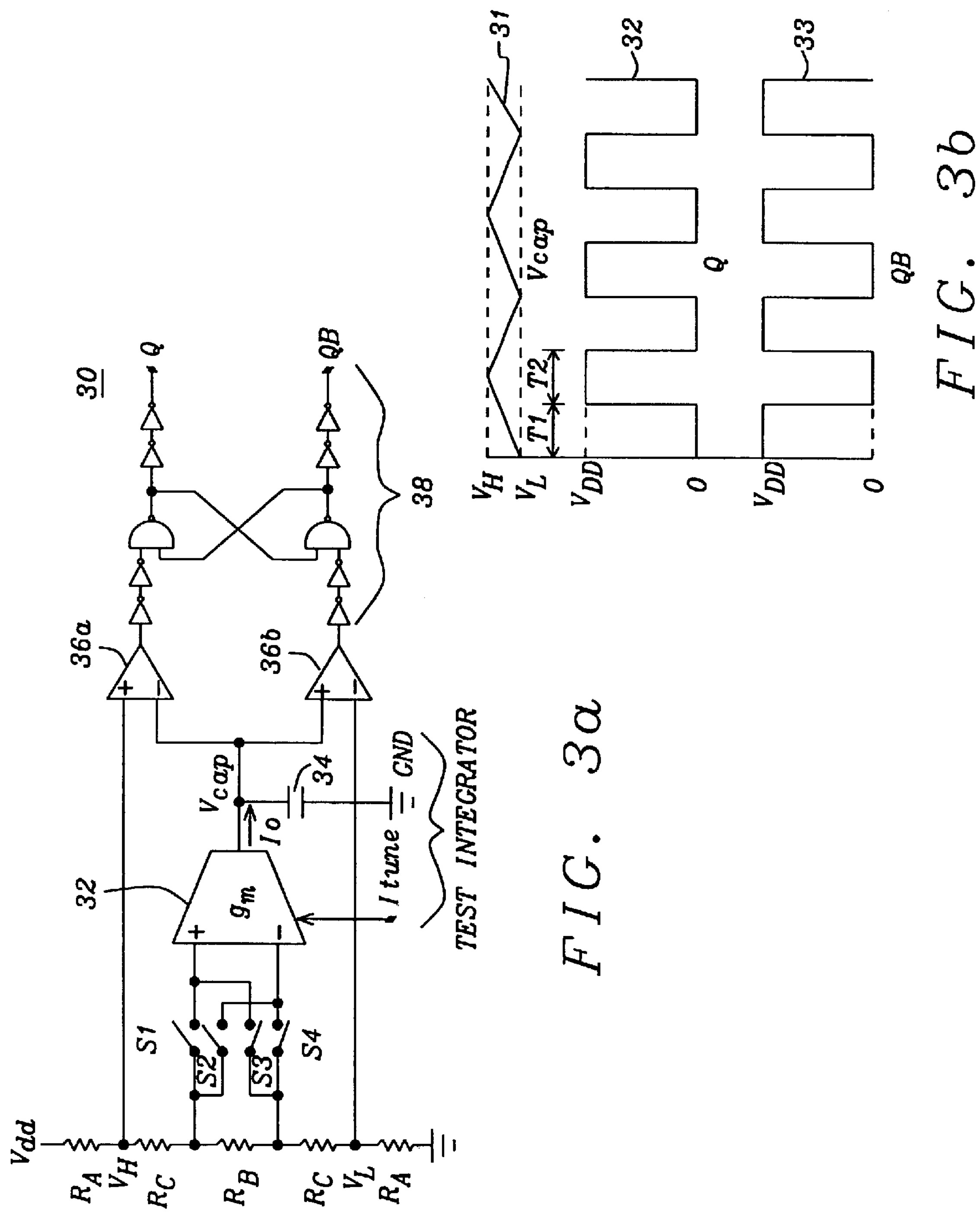
FIG. 3*a* is a schematic of a first preferred embodiment of a CCO for a time-constant tuning PLL of the present invention.
FIG. 3*b* is a graph of the input and output waveforms of FIG. 3*a*.

FIG. 3*a* shows the schematic of the first preferred embodiment of the inventive relaxation CCO 30. A test integrator is formed out of the test transconductarnce amplifier 32 (of transconductance *gm*) and a capacitor 34 (of capacitance C). The output Veap of the integrator is fed to two comparators 36*a* and 36*b*. The outputs of the comparators feed a SR latch 38 with outputs Q and QB. SR latch 38 is not further described here since it is a basic component of digital circuitry and well known. The latch controls the polarity of the input DC voltage (across $R_B$) to the transconductance amplifier. A switching network comprising switching means S1, S2, S3, and S4 is coupled across resistor $R_B$ of a resistor string and the plus and minus inputs of transconductance amplifier 32. The resistor string itself is a series network of resistors with values $R_A$, $R_C$, $R_B$, $R_C$, and $R_A$ coupled between voltage supply $V_{DD}$ and its return side (typically ground GND). $V_H$ and $V_L$ are nodes along the resistor string which couple to the plus and minus inputs of comparators 36*a* and 36*b*, respectively. The output Veap of transconductance amplifier 32 couples to the minus and plus input of comparators 36*a* and 36*h,* respectively, and to capacitor 34. In addition, current $I_{tune}$ is applied to transconductance amplifier 32 of FIG. 3*a* as well as all transconductance amplifiers 32 of FIGS. 4*a*, 5*a* (including transconductance amplifier 52), and 6*a*.

If Q is high and QB low (latch set), switching means $S_1$ and $S_4$ are open and $S_2$ and $S_3$ are closed. If QB is high and Q low (latch reset), switching means $S_1$ and $S_4$ are closed with $S_2$ and $S_3$ open. The latter state (when the latch is reset) applies the small voltage across $R_B$ at the input to the integrator and as a consequence, its output Vcap rises linearly with time. This continues till Vcap reaches $V_H$ and the upper comparator trips setting the latch (Q is high and QB low). Now $S_1$, $S_4$ opens and $S_2$, $S_3$ closes. This also applies the small voltage across $R_B$ to the input of the integrator, but in the opposite direction. As a result; Vcap now goes down linearly with time till it reaches $V_L$. At this point, the lower comparator trips and resets the latch. Therefore the above two sequences will repeat again and again causing continuous oscillation to take place. FIG. 3*b* displays the waveshapes at nodes Vcap (Curve 31), Q, and QB (Curves 32 and 33, respectively). Note that the graphs of FIGS. 3*b*, 4*b*, 5*b*, and 6*b* represent voltages in the vertical axis.

Below is the calculation to find the oscillation frequency $f_0$.

$$V_L = \frac{R_A}{\sum R} V_{DD},\ V_H = \frac{R_A + 2R_C + R_B}{\sum R} V_{DD},$$

$$\text{where } \Sigma R = 2R_A + R_C + R_H \tag{1}$$

$$I_O = g_m \frac{R_B}{\sum R} V_{DD} \tag{2}$$

$$T_1 = T_2 = \frac{C(V_H - V_L)}{I_O} = \left(1 + \frac{2R_C}{R_B}\right)\frac{C}{g_m} \tag{3}$$

$$f_O = \frac{1}{T_1 + T_2} = \frac{1}{2\left(1 + \frac{2R_C}{R_B}\right)} \frac{g_m}{C} \tag{4}$$

From (4)

$$f_0 \cong \frac{1}{2\pi} \frac{g_m}{C},$$

if $$\frac{R_C}{R_B} = 1.07 \tag{5}$$

Also, $$f_0 = \frac{1}{2} \frac{g_m}{C},$$

$$\text{if } R_C = 0 \tag{6}$$

Equation (5) shows that the circuit can be adjusted to have a frequency very nearly equal to that of the traditional two-integrator sinusoidal oscillator.

$I_{tune}$ is the DC current input to adjust the $g_m$ of the transconductance amplifier. This means the oscillation frequency $f_0$ of the CCO can be adjusted by varying $I_{tune}$. When this CCO in used in the PLL shown in FIG. 1, we have:

$$f_{REF} = f_0 = \frac{1}{2\left(1+\frac{2R_C}{R_B}\right)}\frac{g_m}{C} \quad (7)$$

from (7) we have:

$$\frac{g_m}{C} = 2\left(1+\frac{2R_C}{R_B}\right)f_{REF} \quad (8)$$

Since $R_C/R_B$ is a constant, the $g_m/C$ of the test integrator is determined directly by $f_{REF}$. If all the integrators in a $g_m$-C filter are made identical to the test integrator and if $I_{tune}$ from the PLL is used to control each transconductor (using current mirroring), then the bandwidth of the filter (determined by $g_m/C$) is also determined by $f_{REF}$ and can be tuned by it. Equation (8) shows that there is a great flexibility in choosing $f_{REF}$ or $f_0$ due to the ratio $R_C/R_B$. In the case of the traditional sinusoidal oscillator, the constant multiplier of $f_{REF}$ in (8) would be fixed at $2\pi$.

The transconductance amplifier and the integrator formed by it are referred to as 'test' integrators because they are identical to those used in the main filter for which time-constant or bandwidth tuning one wants to do. The problem is to find out the '$g_m$' of the ones in the main filter. Since this cannot be done directly without affecting the filter performance, an additional integrator, identical to the one in the filter, is used as a 'test' element and its '$g_m$' is found out instead and corrected with a PLL using the inventive circuit.

Figure 4A:
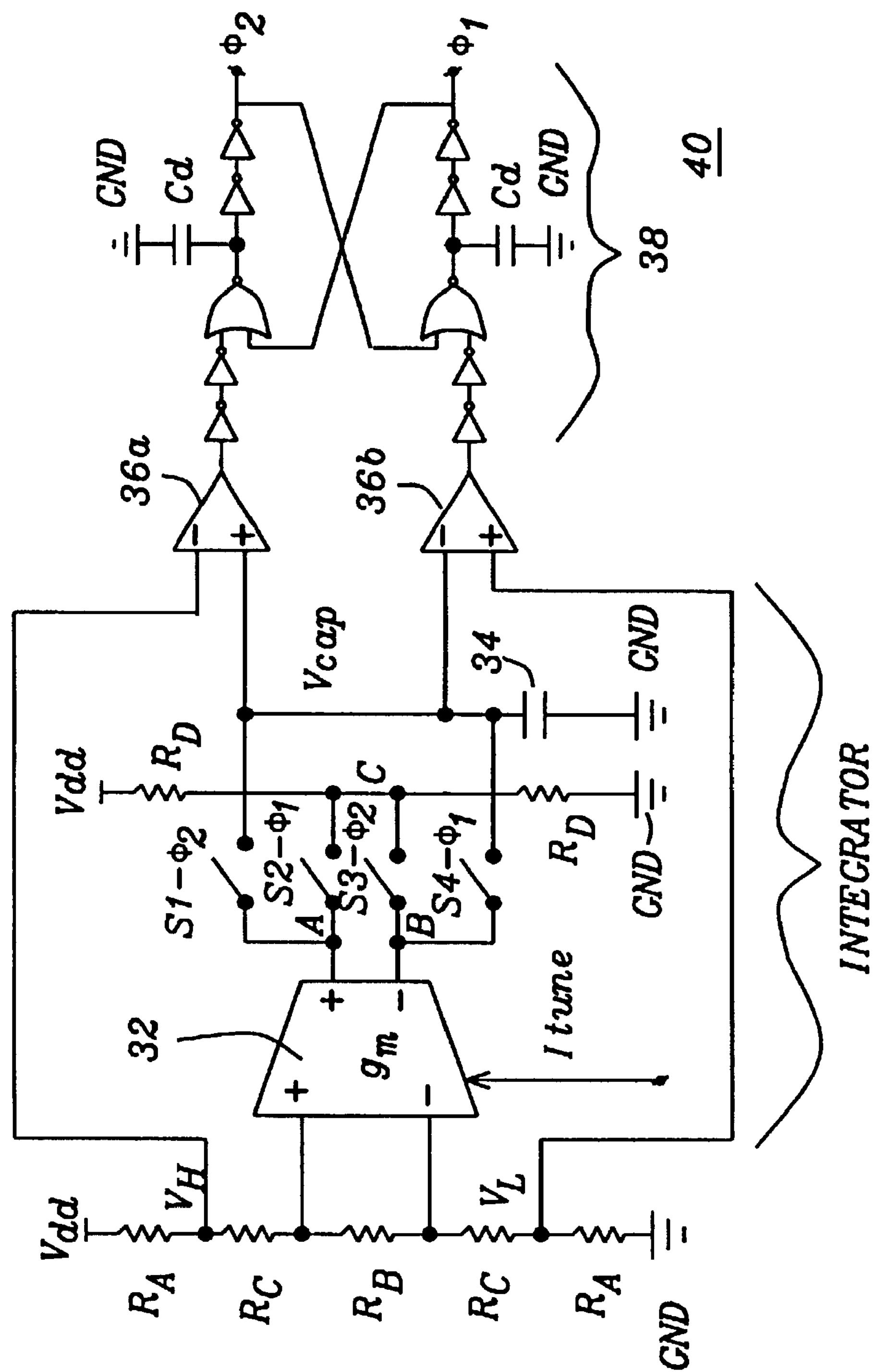
FIG. 4*a* is a schematic of a second preferred embodiment of a CCO for a time-constant tuning PLL of the present invention.
Figure 4B:
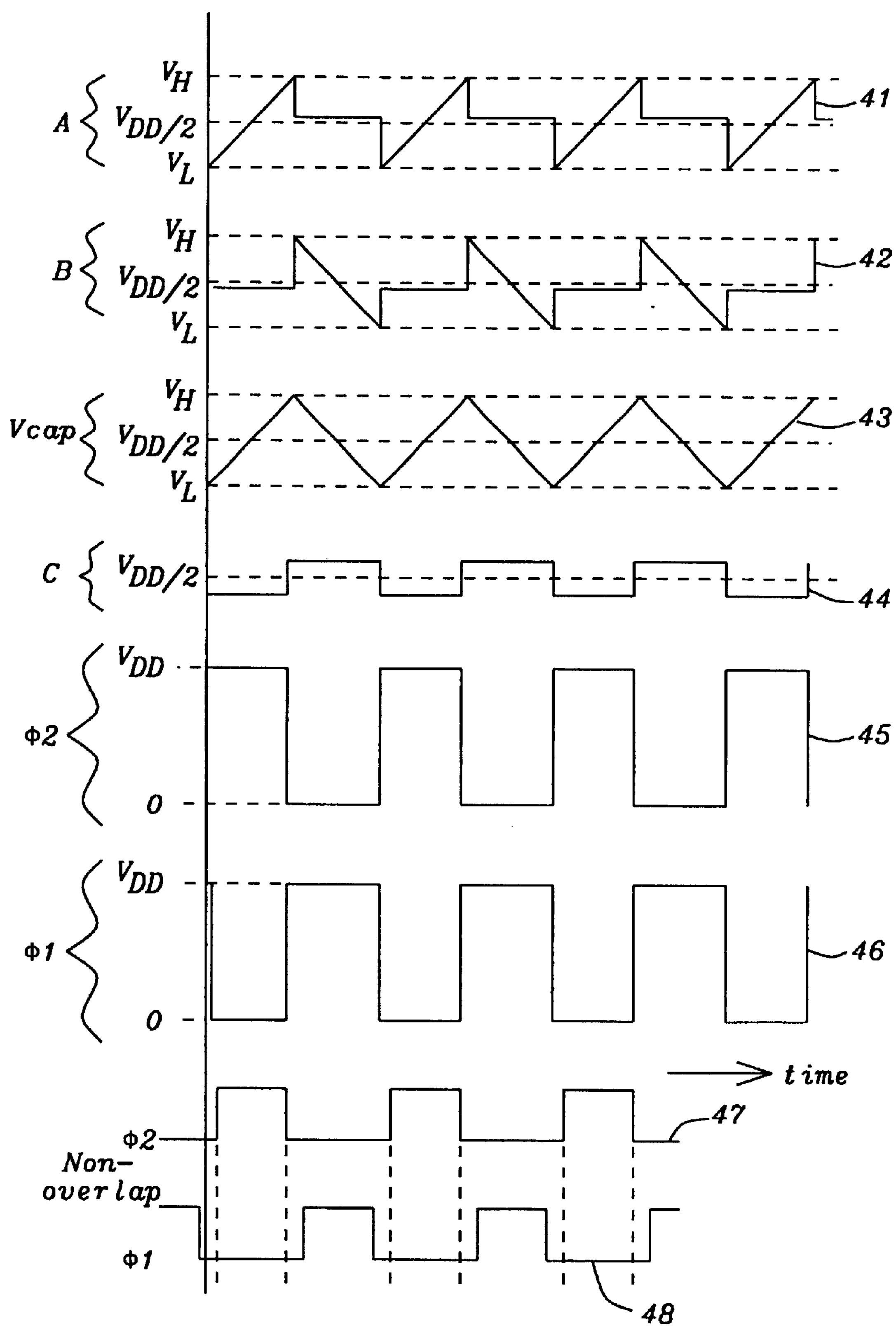
FIG. 4*b* is a graph of the input and output waveforms of FIG. 4*a*.

FIG. 4*a* shows a second preferred embodiment of a CCO in the form of CCO 40. Here differential outputs A (+) and B(−) are used for the transconductor 32. However, again only one timing capacitor 34 is used. This implementation uses output switching instead of input switching of FIG. 3*a*. This helps in getting rid of any delay through the transconductor and, therefore, allows higher frequency of operation. It is to be noted that non-overlapping output waveforms are generated, as shown in FIG. 4*b* Curves 47 and 48, to avoid discharging of the timing capacitor 34 during switching. Curves 47 and 48 are enlarged sections of Curves 45 and 46, respectively, to more clearly demonstrate non-overlapping. FIG. 4*b* also shows the waveforms for outputs A and B (Curves 41 and 42, respectively), the waveform at Vcap and node C (Curves 43 and 44, respectively), and output waveforms for ϕ2 and ϕ1 (Curves 45 and 46, respectively). The resistor string of FIG. 4*a* is the same as that for FIG. 3*a* including connections to transconductor 32, comparators 36*a* and 36*b*, $V_{DD}$ and ground. A switching network comprising switching means S1–4 is coupled between outputs A and B and nodes Vcap and C. Vcap in turn is coupled to the positive and negative inputs of comparators 36*a* and 36*b*, respectively, and via timing capacitor 34 (of capacitance C) to ground. Node C is coupled via resistors $R_D$ to both $V_{DD}$ and ground. Note also that capacitors Cd are connected at the NOR gates of SR latch 38 to help generate the non-overlap. $R_D$ for FIG. 4*a* is defined as:

$$R_D = R_A + R_C + R_B/2$$

Note that the suffix for S1 to S4 indicates during which phase the switching means is active, such that: S1-ϕ2 and S3-ϕ2 are on when output ϕ2 of SR latch 38 is high, and that S2-ϕ1 and S4-ϕ1 are on when output ϕ1 is high.

Figure 5A:
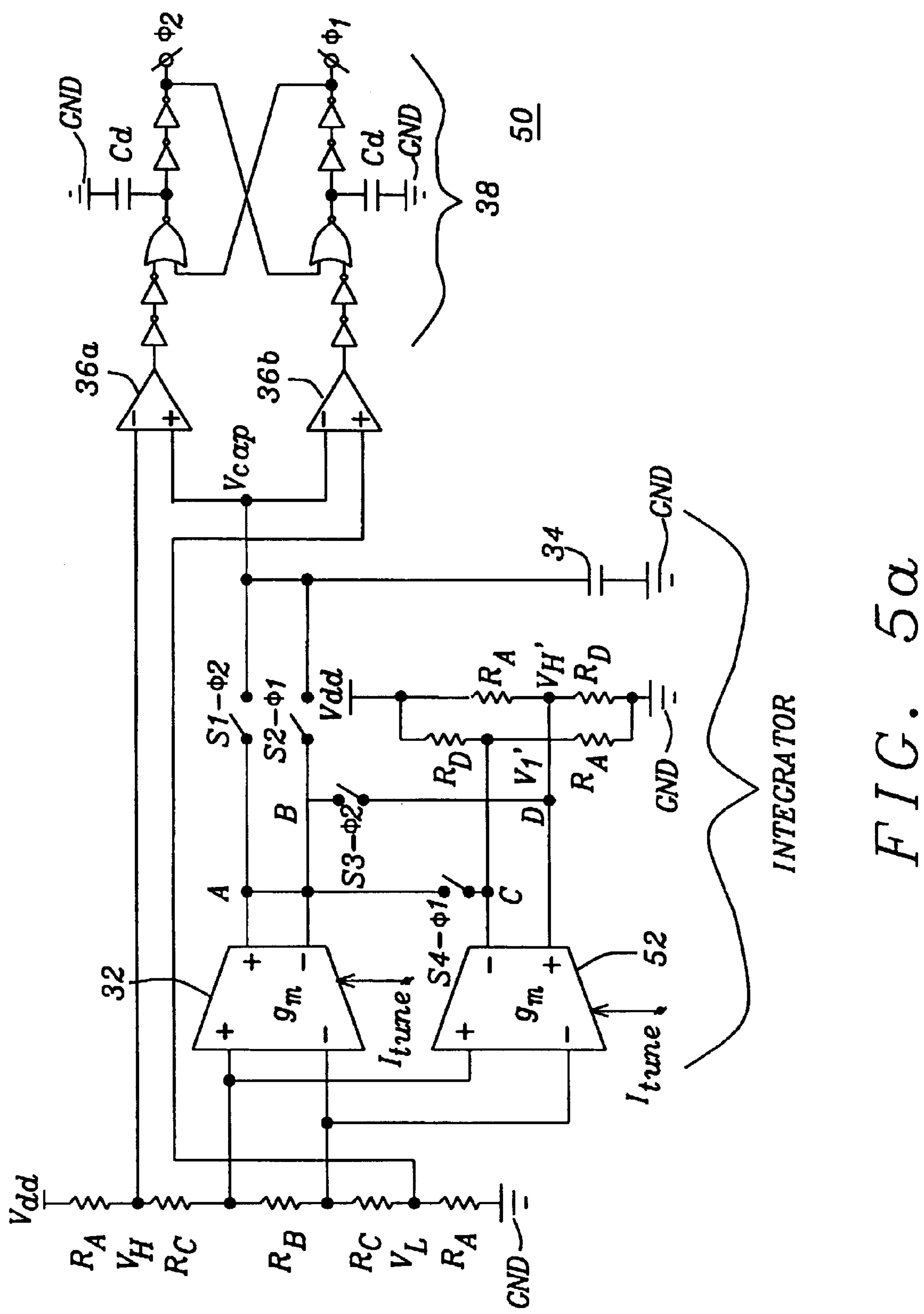
FIG. 5*a* is a schematic of a third preferred embodiment of a CCO for a time-constant tuning PLL of the present invention.

FIG. 5*a* shows a third preferred embodiment of a CCO in the form of CCO 50. This implementation uses two differential output transconductors 32 and 52. This implementation also employs output switching. The resistor string of FIG. 5*a* is the same as that for FIG. 3*a* including connections to transconductor 32, comparators 36*a* and 36*b*, $V_{DD}$ and ground. A switching network comprising switching means S1 to S4 is coupled between outputs A and B of transconductor 32 and node Vcap and outputs C and D of transconductor 52. More specifically, A is coupled via S4-ϕ1 to C and via S1-ϕ2 to Vcap, B is coupled via S3-ϕ2 to D and via S2-ϕ1 to Vcap. As in FIG. 4, Vcap is coupled to the positive and negative inputs of comparators 36*a* and 36*b*, respectively, and via timing capacitor 34 (of capacitance C) to ground. Outputs C and D are coupled to nodes $V_L'$ and $V_H'$, respectively. Nodes $V_L'$ and $V_H'$ are part of a second resistive network comprising two resistor strings in parallel having resistors of value $R_A$ and $R_D$ in series between $V_{DD}$ and ground, respectively, and, similarly, resistors $R_D$ and $R_A$ in series between $V_{DD}$ and ground, respectively. $R_D$ is defined as: $R_D=R_A+R_B+2R_C$. Note that the voltages at nodes $V_H$ and $V_H'$ are identical, so are the voltages at nodes $V_L$ and $V_L'$.

Current from one output of the transconductor (32) charges the timing capacitor 34 of capacitance C and the other transconductor 52 helps to maintain continuity of the current from the other output of transconductor 32. The advantage of this implementation is that transconductor 32 outputs A and B do not see voltage jumps when the switching means connect them to the timing capacitor, unlike in the second embodiment of FIG. 4. This enables higher frequency of operation. Here also, non-overlapping output waveforms are generated. As in FIG. 4*a*, capacitances Cd are added to SR latch 38, which help to generate the non-overlapping waveform.

Note that the suffix for S1 to S4 indicates during which phase the switching means is active, such that: S1-ϕ2 and S3-ϕ2 are on when output ϕ2 of SR latch 38 is high, and that S2-ϕ1 and S4-ϕ1 are on when output ϕ1 is high.

Figure 5B:
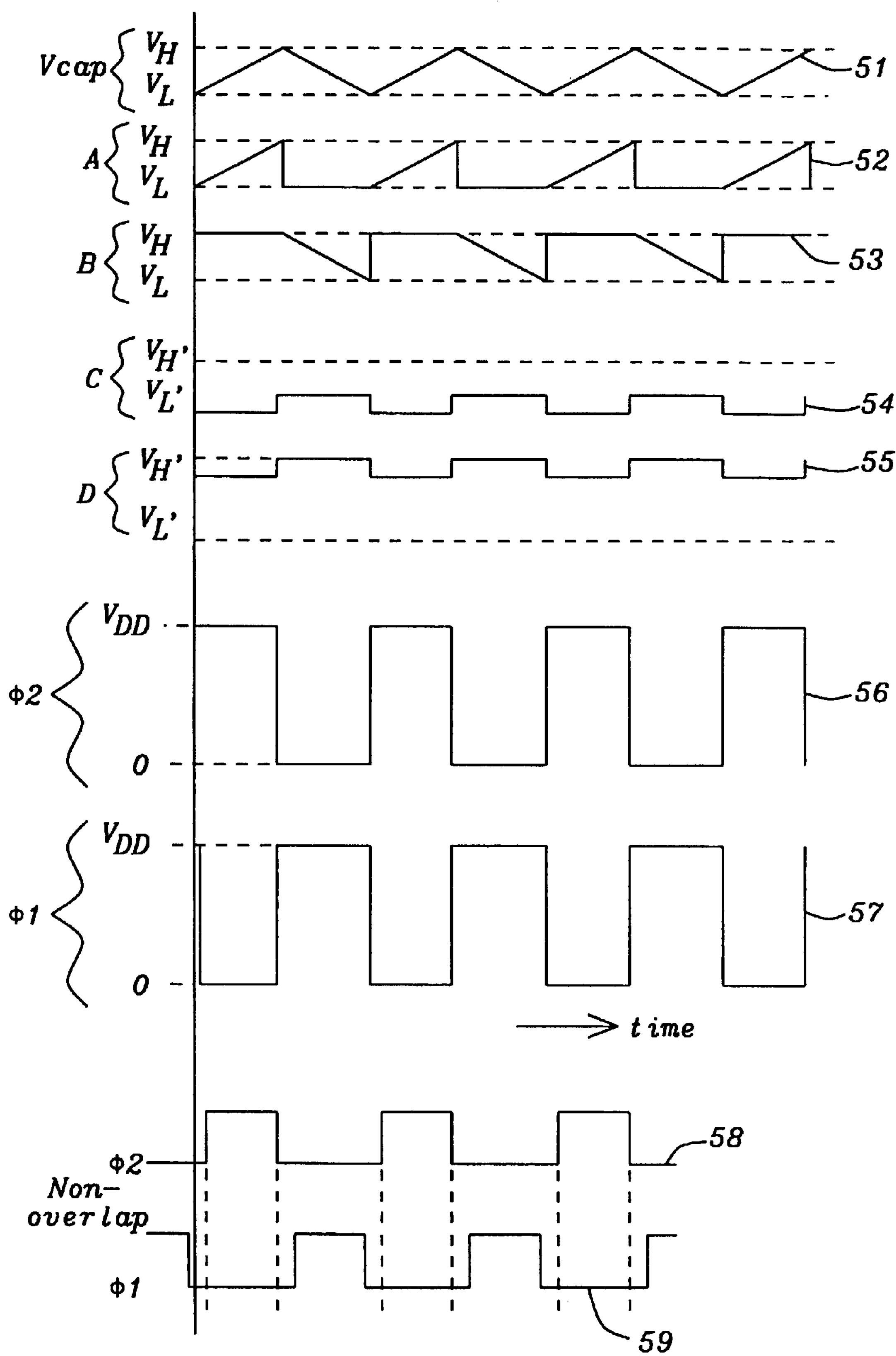
FIG. 5*b* is a graph of the input and output waveforms of FIG. 5*a*.

FIG. 5*b* shows the waveforms for Vcap (Curve 51), A (Curve 52), B (Curve 53), C (Curve 54), D (Curve 55), ϕ2 (Curve 56), and ϕ1 (Curve 57). Curves 58 and 59 are enlarged sections of Curves 56 and 57 to more clearly demonstrate non-overlapping.

Figure 6A:
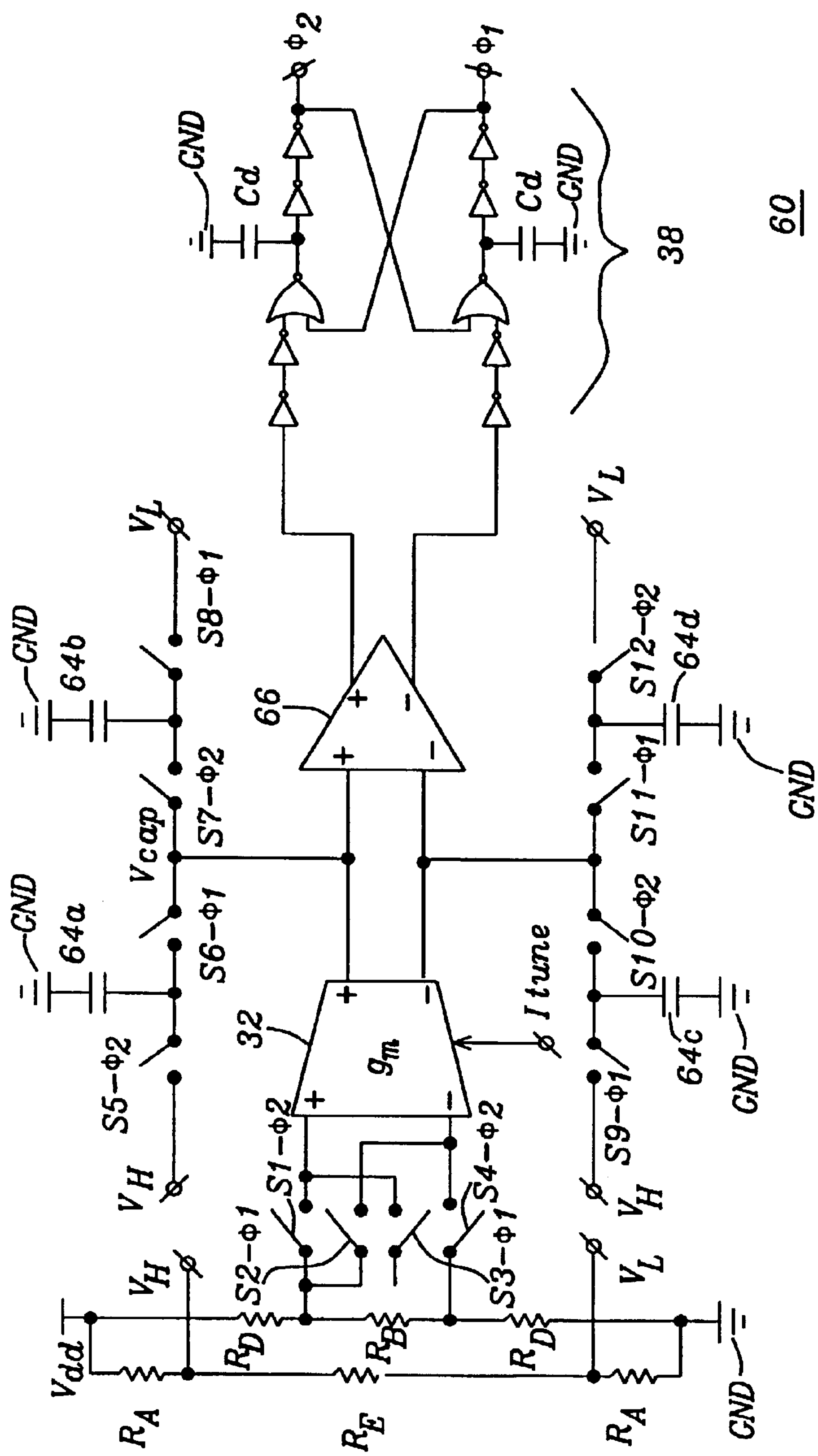
FIG. 6*a* is a schematic of a fourth preferred embodiment of a CCO for a time-constant tuning PLL of the present invention.
Figure 6B:
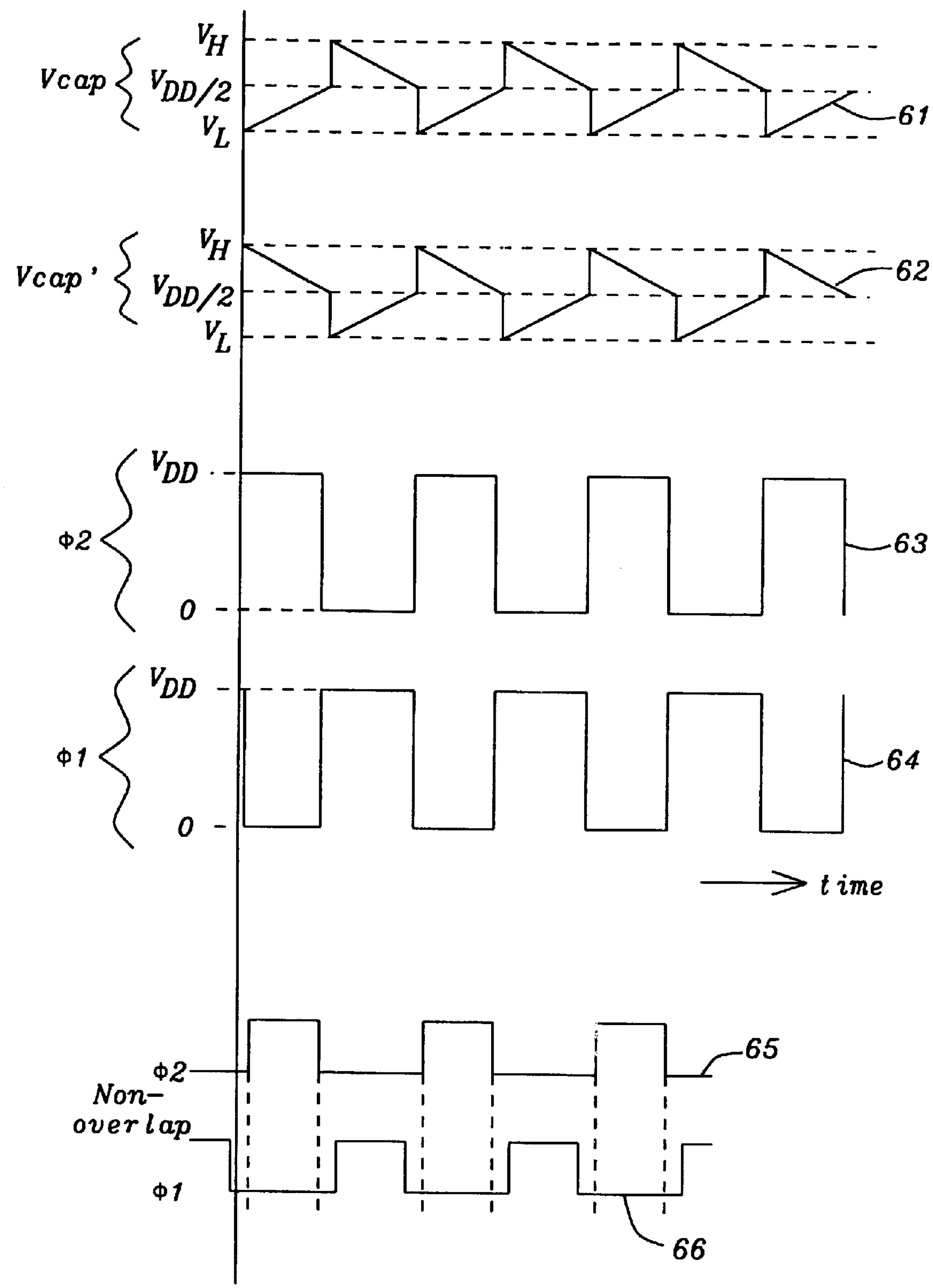
FIG. 6*b* is a graph of the input and output waveforms of FIG. 6*a*.

FIG. 6*a* shows a fourth preferred embodiment of a CCO in the form of CCO 60. This is a fully differential implementation employing both input and output switching and four timing capacitors 64*a–d* each of capacitance C. Each timing capacitor is charged to the appropriate reference voltage and applied to the output of transconductor 32 for integration. The integration of a pair of capacitors is conducted while charging of the other pair is carried out. In this case also a non-overlapping output waveform is generated. However, the output frequency is double of the previous embodiments. Being fully differential, this circuit provides a truly 50% duty cycle output waveform as errors due to minor mismatches in the differential transistors balance off.

Still referring to FIG. 6*a*, the circuit is explained in more detail. Resistive strings $R_A$–$R_E$–$R_A$ and $R_D$–$R_B$–$R_D$ are both coupled between $V_{DD}$ and a reference potential (typically ground as shown in FIG. 6*a*). The node between $R_A$ and $R_E$ is labelled $V_H$, and the node between $R_E$ and $R_A$ is labelled $V_L$. In the identical switching arrangement as that of FIG. 3*a* for switching means S1 to S4, the high side of $R_B$ couples via S1-ϕ2 and S2-ϕ1 to the positive and negative input of transconductor 32, respectively. The low side of $R_B$ couples via S3-ϕ1 and S4-ϕ2 to the positive and negative input of transconductor 32, respectively. The plus and minus output of transconductor 32 couples to the plus and minus input of dual-output comparator 66, respectively. The plus and minus outputs of comparator 66 feed SR latch 38. Coupled between nodes $V_H$ and $V_L$ are in series switching means S5-φ2, S6-φ1, S7-φ2, S8-φ1. The junction between S6-φ1 and S7-φ2 is node Vcap. A capacitor 64$a$ is coupled between ground and the junction of S5-φ2 and S6-φ1, and capacitor 64$b$ is coupled between ground and the junction of S7-φ2 and S8-φ. Node Vcap connects to the plus output of transconductor 32. Similarly, coupled between nodes $V_H$ and $V_L$ are in series switching means S9-φ1, S10-φ2, S11-φ1, S12-φ2. The junction between S10-φ2 and S11-φ1 is node Vcap' and connects to the negative output of transconductor 32. Capacitor 64$c$ is coupled between ground and the junction of S9-φ1 and S10-φ2, and capacitor 64$d$ is coupled between ground and the junction of S11-φ1 and S10-φ2. Node Vcap' connects to the minus output of transconductor 32. Resistor $R_D$ is defined as: $R_D=R_A+R_C$, and resistor $R_E$ is defined as: $R_E=R_B+2R_C$.

Note that the suffix for S1 to S12 indicates during which phase the switching means is active, e.g., S1-φ2, S4-φ2 and S5-φ2 are on when output φ2 of SR latch 38 is high, and S2-φ1 S3-φ1, 6-φ1 are on when output φ1 is high.

FIG. 6$b$ shows the waveforms for Vcap (Curve 61), Vcap'(Curve 62), φ2 (Curve 63), and φ1 (Curve 64). ). Curves 65 and 66 are enlarged sections of Curves 63 and 64 to more clearly demonstrate non-overlapping, caused by capacitors Cd.

The following table shows the comparison of the four embodiments:

| Embodiment no. | H.F. capability | Circuit complexity | Waveform symmetry |
|---|---|---|---|
| 1 | Low | Low | Good |
| 2 | Medium | Medium | Average |
| 3 | High | High | Average |
| 4 | Low | Medium | Very good |

Figure 7:
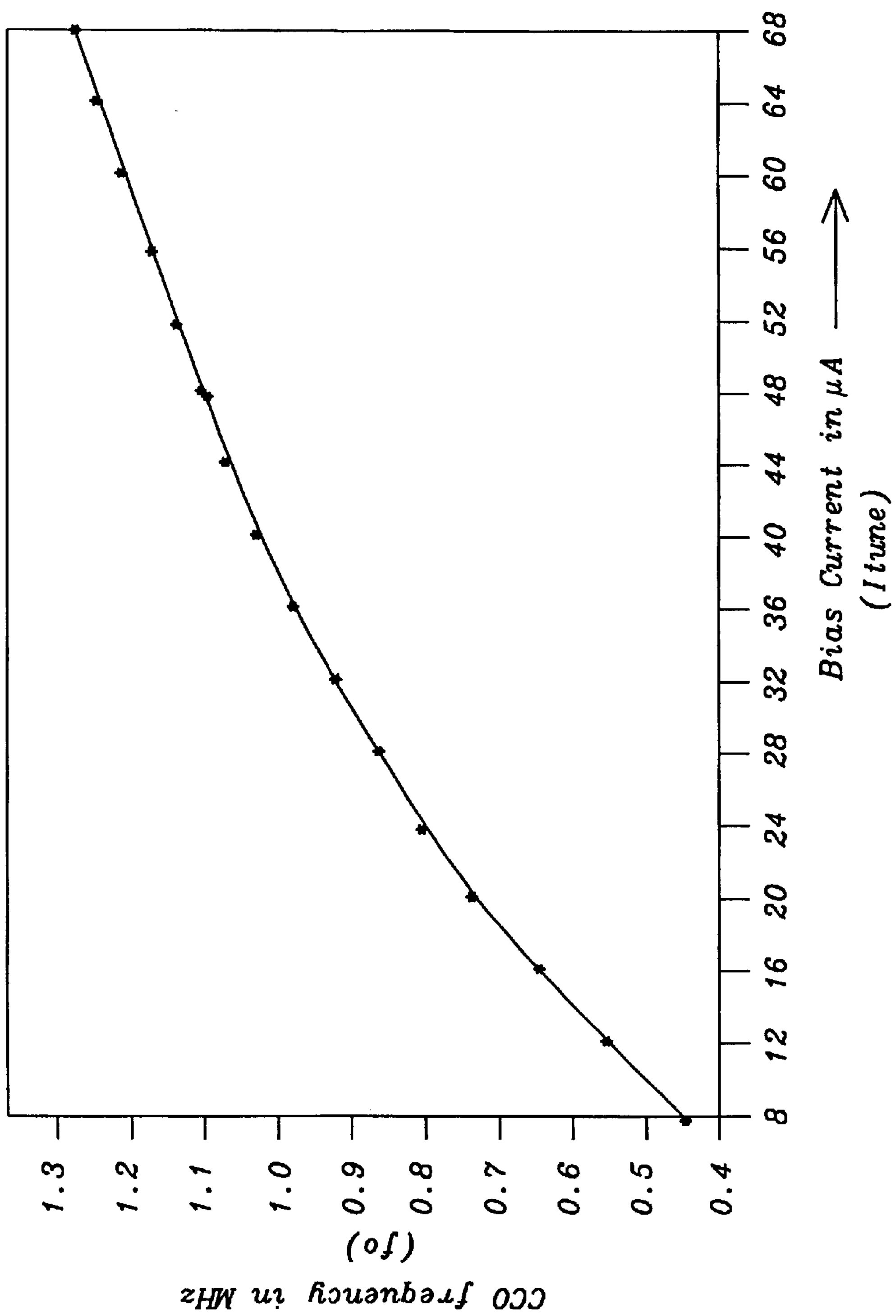
FIG. 7 is a graph of the tuning characteristics of the typical CCO of the preferred embodiment of the present invention.

Simulation Results:

Simulation results show that the circuit functions as expected. The calculated (with formula) and simulation frequency are very close. The curve of FIG. 7 shows a typical tuning characteristic of the CCO relating the bias current ($I_{tune}$) to the CCO frequency ($f_0$), valid for any of the above described preferred embodiments.

Figure 8:
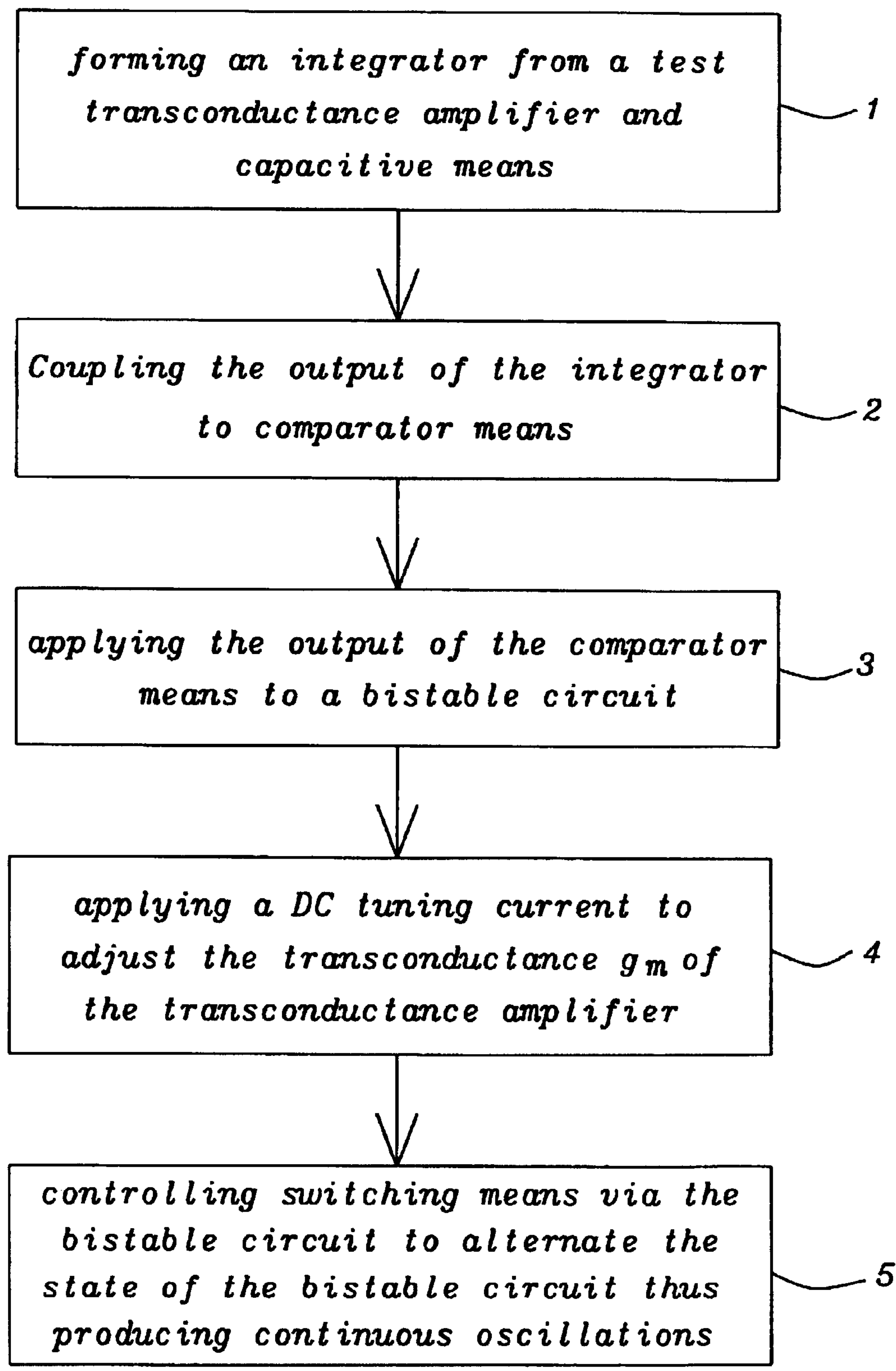
FIG. 8 is a block diagram of the preferred method of the invention.

The method of providing a relaxation current controlled oscillator is shown in FIG. 8 and comprises the following steps:

Block 1: forming an integrator from a test transconductance amplifier and capacitive means;

Block 2: coupling the output of the integrator to comparator means;

Block 3: applying the output of the comparator means to a bistable circuit;

Block 4: applying a DC tuning current to adjust the transconductance $g_m$ of the transconductance amplifier;

Block 5: controlling switching means via the bistable circuit to alternate the state of the bistable circuit thus producing continuous oscillations.

In summary the advantages of the present invention include:

(1) A relaxation oscillator which is compatible with PLL-based tuning of $g_m$-C filters.

(2) No start-up/amplitude control problems have to be overcome.

(3) There is more flexibility in deciding $f_{REF}$ or $f_0$.

While the invention has been particularly shown and described with reference to the preferred embodiments thereof, it will be understood by those skilled in the art that various changes in form and details may be made without departing from the spirit and scope of the invention.

What is claimed is:

1. A relaxation current controlled oscillator, comprising:

an integrator having a first and a second input and at least one output, said integrator integrating a voltage signal applied at its inputs, said integrator further comprising a transconductance amplifier having a first and a second input and at least one output, said transconductance amplifier having a transconductance $g_m$, said transconductance amplifier providing at its output a signal proportional to its inputs, said inputs of said transconductance amplifier coupled to said inputs of said integrator, said output of said transconductance amplifier coupled to said output of said integrator; and capacitive means coupled to the output of said transconductance amplifier, where said capacitive means is charged up by the output signal of said transconductance amplifier;

first comparator means for comparing the output signal of said transconductance amplifier against a first reference voltage, said first comparator means setting a Set-Reset type flip-flop when said output signal of said transconductance amplifier matches said first reference voltage;

second comparator means for comparing the output signal of said transconductance amplifier against a second reference voltage, said second comparator means resetting a Set-Reset type flip-flop when said output signal of said transconductance amplifier matches said second reference voltage; and first and second switching means in communication with said inputs of said transconductance amplifier for controlling the polarity of said voltage signal applied to said inputs of said transconductance amplifier.

2. The relaxation current controlled oscillator of claim 1, wherein said output of said flip-flop and the inverse of said output of said flip-flop control said first and said second switching means thus producing continuous oscillations.

3. The relaxation current controlled oscillator of claim 1, wherein a DC tuning current is applied to said transconductance amplifier to adjust the transconductance $g_m$ of said transconductance amplifier.

4. The relaxation current controlled oscillator of claim 1, wherein the oscillation frequency $f_0$ of said relaxation current controlled oscillator can be adjusted by varying a DC tuning current applied to said transconductance amplifier.

5. The relaxation current controlled oscillator of claim 1, wherein said voltage signal at said input of said integrator is derived from a network comprising resistive means.

6. The relaxation current controlled oscillator of claim 5, wherein said network comprising resistive means is coupled between a positive voltage supply and its return side.

7. A relaxation current controlled oscillator, comprising:

an integrator having a first and a second input and a first and a second output, said integrator integrating a voltage signal applied at its inputs, said integrator further comprising a transconductance amplifier having a first and a second input and a first and a second output, said transconductance amplifier having a transconductance $g_m$, said transconductance amplifier providing at its outputs a signal proportional to its inputs, said inputs of said transconductance amplifier coupled to said inputs of said integrator, said outputs of said transconductance amplifier coupled to said outputs of said integrator; and capacitive means coupled to the outputs of said transconductance amplifier, where the voltage across said capacitive means is controlled by the output signals of said transconductance amplifier;

first comparator means for comparing a first output signal of said transconductance amplifier against a first reference voltage, said first comparator means setting a Set-Reset type flip-flop when said output signal of said transconductance amplifier matches said first reference voltage;

second comparator means for comparing the output signal of said transconductance amplifier against a second reference voltage, said second comparator means resetting a Set-Reset type flip-flop when said output signal of said transconductance amplifier matches said second reference voltage;

first and second switching means coupled between said outputs of said transconductance amplifier and said first and second comparator for controlling the polarity of said voltage signal applied to the positive input of said first comparator and the negative input of said second comparator, respectively; and said first and said second switching means further coupled between said outputs of said transconductance amplifier and a first terminal of resistive means.

8. The relaxation current controlled oscillator of claim 7, wherein said output of said flip-flop and the inverse of said output of said flip-flop control said first and said second switching means thus producing continuous oscillations.

9. The relaxation current controlled oscillator of claim 7, wherein a DC tuning current is applied to said transconductance amplifier to adjust the transconductance $g_m$ of said transconductance amplifier.

10. The relaxation current controlled oscillator of claim 7, wherein the oscillation frequency $f_0$ of said relaxation current controlled oscillator can be adjusted by varying a DC tuning current applied to said transconductance amplifier.

11. The relaxation current controlled oscillator of claim 7, wherein said voltage signal at said inputs of said integrator is derived from a network comprising resistive means.

12. The relaxation current controlled oscillator of claim 11, wherein said network comprising resistive means is coupled between a positive voltage supply and its return side.

13. The relaxation current controlled oscillator of claim 12, wherein a second terminal of said resistive means is coupled to said positive voltage supply return side.

14. A relaxation current controlled oscillator, comprising:

an integrator having differential inputs and outputs, said integrator integrating a voltage signal applied at its inputs, said integrator further comprising a first transconductance amplifier having differential inputs and outputs, said first transconductance amplifier having a transconductance $g_m$, said first transconductance amplifier providing at its outputs a signal proportional to its inputs, said inputs of said first transconductance amplifier coupled to said inputs of said integrator, said outputs of said first transconductance amplifier coupled to said outputs of said integrator;

a second transconductance amplifier having differential inputs and outputs, said second transconductance amplifier having a transconductance $g_m$, said second transconductance amplifier providing at its output a signal proportional to its inputs, said inputs of said second transconductance amplifier coupled to said inputs of said integrator, said outputs of said second transconductance amplifier coupled to said outputs of said integrator; and capacitive means in communication with the differential outputs of said first transconductance amplifier, where said capacitive means is charged up by differential output signals of said first transconductance amplifier depending on the state of first and second switching means;

first comparator means for comparing the positive output signal of said first transconductance amplifier against a first reference voltage, said first comparator means forcing a Set-Reset type flip-flop to a first state when said output signal of said transconductance amplifier matches said first reference voltage;

second comparator means for comparing the negative output signal of said first transconductance amplifier against a second reference voltage, said second comparator means forcing said Set-Reset type flip-flop to the opposite of said first state when said output signal of said transconductance amplifier matches said second reference voltage;

said first and second switching means coupled between said outputs of said first transconductance amplifier and said first and second comparator for controlling the polarity of said voltage signal applied to the positive input of said first comparator and the negative input of said second comparator, respectively;

said first and second switching means further coupled between said outputs of said first and said second transconductance amplifier; and a first network of resistive means coupled to the outputs of said second transconductance amplifier.

15. The relaxation current controlled oscillator of claim 14, wherein said output of said flip-flop and the inverse of said output of said flip-flop control said first and said second switching means thus producing continuous oscillations.

16. The relaxation current controlled oscillator of claim 14, wherein a DC tuning current is applied to said first and said second transconductance amplifier to adjust the transconductance $g_m$ of said first and said second transconductance amplifier.

17. The relaxation current controlled oscillator of claim 14, wherein the oscillation frequency $f_0$ of said relaxation current controlled oscillator can be adjusted by varying a DC tuning current applied to said first and said second transconductance amplifier.

18. The relaxation current controlled oscillator of claim 14, wherein said first switching means is controlled by the state opposite to said first state of said flip-flop.

19. The relaxation current controlled oscillator of claim 14, wherein said second switching means is controlled by said first state of said flip-flop.

20. The relaxation current controlled oscillator of claim 14, wherein said voltage signal at said differential inputs of said integrator is derived from a second network comprising resistive means.

21. The relaxation current controlled oscillator of claim 20, wherein said first and said second network comprising resistive means are coupled between a positive voltage supply and its return side.

22. A relaxation current controlled oscillator, comprising:

an integrator having differential inputs and outputs, said integrator integrating a voltage signal applied at its inputs, said integrator further comprising:

a transconductance amplifier having differential inputs and outputs, said transconductance amplifier having a transconductance $g_m$, said transconductance amplifier providing at its outputs a signal proportional to its inputs, said inputs of said transconductance amplifier coupled to said inputs of said integrator, said output of said transconductance amplifier coupled to said output of said integrator; and capacitive means in communication with the outputs of said transconductance amplifier, where the voltage across said capacitive means is controlled by the output signals of said transconductance amplifier;

comparator means for comparing the output signals of said transconductance amplifier, said comparator means controlling the state of a Set-Reset type flip-flop based on said output signal of said transconductance amplifier;

a resistive network coupled between a positive voltage supply and its return side, said resistive network providing voltage references for said transconductance amplifier;

a first set of switching means, coupled between said resistive network and the inputs of said transconductance amplifier, for reversing the polarity applied to said inputs of said transconductance amplifier, said first set of switching means responsive to the state of said flip-flop; and a second set of switching means serially coupled between said voltage references, said second set of switching means controlling the connection between the output of said transconductance amplifier and said capacitive means, said second set of switching means responsive to the state of said flip-flop.

23. The relaxation current controlled oscillator of claim 22, wherein said output of said flip-flop and the inverse of said output of said flip-flop control said switching means thus producing continuous oscillations.

24. The relaxation current controlled oscillator of claim 22, wherein a DC tuning current is applied to said transconductance amplifier to adjust the transconductance $g_m$ of said transconductance amplifier.

25. The relaxation current controlled oscillator of claim 22, wherein the oscillation frequency $f_0$ of said relaxation current controlled oscillator can be adjusted by varying a DC tuning current applied to said transconductance amplifier.

26. The relaxation current controlled oscillator of claim 22, wherein said first and said second set of switching means further comprise a first switching means, said first switching means controlled by the inverse output of said flip-flop.

27. The relaxation current controlled oscillator of claim 22, wherein said first and said second set of switching means further comprise a second switching means, said second switching means controlled by the output of said flip-flop.

28. The method of providing a relaxation current controlled oscillator, comprising the steps of:

a) forming an integrator from a test transconductance amplifier and capacitive means;

b) coupling the output of said integrator to comparator means;

c) applying the output of said comparator means to a bistable circuit;

d) applying a DC tuning current to adjust the transconductance $g_m$ of said transconductance amplifier; and e) controlling switching means via said bistable circuit to alternate the state of said bistable circuit thus producing continuous oscillations.

29. The method of claim 28, wherein said bistable circuit has first and complimentary output signals.

30. The method of claim 28, wherein the input signal to said integrator is produced by a voltage drop across resistive means.

31. The method of claim 28, wherein the polarity of said input signal is controlled by said switching means.

32. The method of claim 28, wherein the output of said integrator is coupled to said capacitive means via said switching means.

33. The method of claim 28, wherein the output of said integrator is coupled to said comparator means via said switching means.

34. The method of claim 28, wherein the oscillation frequency $f_0$ of said transconductance amplifier is adjusted by varying the DC tuning current.

35. A time-constant tuning PLL for $g_m$-C filters with time relaxation oscillator, comprising:

a PLL used for bandwidth tuning of transconductance-capacitor ($g_m$-C) filters, said PLL comprising serially coupled a phase detector, a charge pump, a loop filter, a voltage-current converter, and a relaxation current controlled oscillator, where a first input of said phase detector receives a reference frequency and a second input of said PLL is coupled to the output of said relaxation current controlled oscillator, said output of said relaxation current controlled oscillator providing an oscillation frequency $f_0$, where said relaxation current controlled oscillator is compatible with said PLL, said relaxation current controlled oscillator furthermore providing more flexibility in selection of said reference frequency and said oscillation frequency $f_0$, said relaxation current controlled oscillator further comprising:

an integrator having a first and a second input and at least one output, said integrator integrating a voltage signal applied at its inputs, said integrator further comprising a transconductance amplifier having a first and a second input and at least one output, said transconductance amplifier having a transconductance $g_m$, said transconductance amplifier providing at its output a signal proportional to its inputs, said inputs of said transconductance amplifier coupled to said inputs of said integrator, said output of said transconductance amplifier coupled to said output of said integrator; and capacitive means coupled to the output of said transconductance amplifier, where said capacitive means is charged up by the output signal of said transconductance amplifier;

first comparator means for comparing the output signal of said transconductance amplifier against a first reference voltage, said first comparator means setting a Set-Reset type flip-flop when said output signal of said transconductance amplifier matches said first reference voltage;

second comparator means for comparing the output signal of said transconductance amplifier against a second reference voltage, said second comparator means resetting a Set-Reset type flip-flop when said output signal of said transconductance amplifier matches said second reference voltage; and first and second switching means in communication with said inputs of said transconductance amplifier for controlling the polarity of said voltage signal applied to said inputs of said transconductance amplifier.

36. The time-constant tuning PLL of claim 35, wherein a DC tuning current is applied to said transconductance amplifier to adjust the transconductance $g_m$ of said transconductance amplifier.

37. The time-constant tuning PLL of claim 35, wherein the oscillation frequency $f_0$ of said relaxation current controlled oscillator can be adjusted by varying a DC tuning current applied to said transconductance amplifier.

* * * * *

UNITED STATES PATENT AND TRADEMARK OFFICE

CERTIFICATE OF CORRECTION

PATENT NO. : 6,727,768 B1
DATED : April 27, 2004
INVENTOR(S) : Uday Dasgupta

It is certified that error appears in the above-identified patent and that said Letters Patent is hereby corrected as shown below:

Title page,
Item [54], Title, should read -- RELAXATION CCO FOR PLL-BASED TIME CONSTANT TUNING OF GM-C FILTERS --.

Signed and Sealed this

Twenty-second Day of February, 2005

JON W. DUDAS
*Director of the United States Patent and Trademark Office*